US009990456B1

(12) United States Patent
Lawson et al.

(10) Patent No.: US 9,990,456 B1
(45) Date of Patent: Jun. 5, 2018

(54) ROUTING PROCESS INCLUDING DYNAMICALLY CHANGING PAD SIZES

(71) Applicant: Cadence Design Systems, Inc., San Jose, CA (US)

(72) Inventors: Randall Scott Lawson, Seabrook, NH (US); Brett Allen Neal, Monument, CO (US); Richard Allen Woodward, Jr., San Diego, CA (US); Edmund J. Hickey, Amherst, NH (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days. days.

(21) Appl. No.: 14/674,762

(22) Filed: Mar. 31, 2015

(51) Int. Cl.
*G06F 17/50* (2006.01)

(52) U.S. Cl.
CPC .................. *G06F 17/5077* (2013.01)

(58) Field of Classification Search
CPC ....... H01L 2224/48227; H01L 2224/81; H01L 24/48; H01L 25/0657; G06F 17/5077; G06F 17/50; G06F 2217/84
USPC ................................................. 716/126–131
See application file for complete search history.

(56) References Cited

U.S. PATENT DOCUMENTS

| | | | |
|---|---|---|---|
| 6,330,707 B1 * | 12/2001 | Shinomiya | G06F 17/5077 716/130 |
| 7,472,360 B2 * | 12/2008 | Bartley | H01L 23/49838 257/E23.07 |
| 7,937,681 B2 | 5/2011 | Wadland et al. | |
| 8,479,138 B1 | 7/2013 | Lawson et al. | |
| 8,510,703 B1 * | 8/2013 | Wadland | G06F 17/5077 716/129 |
| 8,904,332 B1 | 12/2014 | Neal et al. | |
| 2002/0083407 A1 * | 6/2002 | Suzuki | G06F 17/5077 257/774 |
| 2008/0010934 A1 * | 1/2008 | Rizzo | G06F 17/5077 52/439 |
| 2009/0199149 A1 * | 8/2009 | Kwong | G06F 17/5068 716/137 |
| 2010/0125822 A1 * | 5/2010 | Lepere | G06F 17/5068 716/119 |

* cited by examiner

*Primary Examiner* — Nghia Doan
(74) *Attorney, Agent, or Firm* — Mark H. Whittenberger, Esq.; Holland & Knight LLP

(57) ABSTRACT

The present disclosure relates to a method for routing in an electronic circuit design. Embodiments may include receiving, at one or more computing devices, the electronic circuit design having a plurality of terminal pads associated therewith. Embodiments may further include generating a change in at least one of a size or an existence of at least one of the plurality of terminal pads. Embodiments may also include routing a portion of the electronic design based upon, at least in part, the generated change.

10 Claims, 25 Drawing Sheets

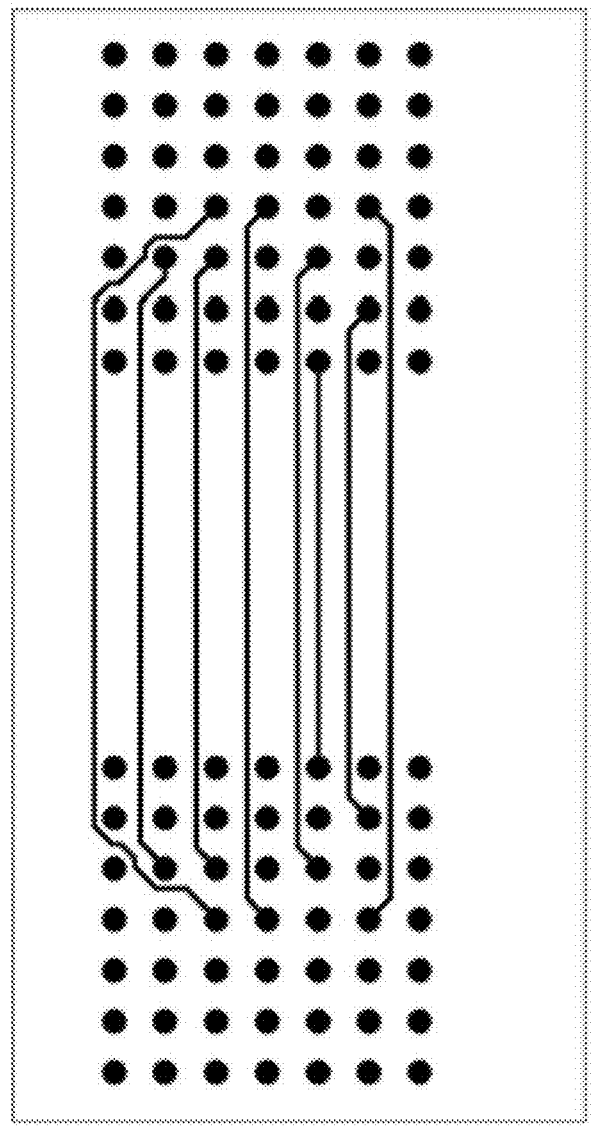
FIG. 7

ROUTING PROCESS INCLUDING DYNAMICALLY CHANGING PAD SIZES

FIELD OF THE INVENTION

The present disclosure relates to electronic design automation (EDA), and more specifically, to a method for routing in an electronic design.

DISCUSSION OF THE RELATED ART

EDA utilizes software tools that may be used in the design and analysis of numerous electronic systems such as printed circuit boards (PCBs) and integrated circuits (ICs). Recent years have seen unprecedented expansion of functional requirements for PCB designs. PCB designers must now cope with a myriad of interconnect topologies and logic signal levels, and must be constantly keen to tolerance stack-up and to implications to signal integrity of an evolving placement/interconnect solution. Designers must balance dozens of variables that may resolve into hundreds of valid and invalid solutions without any real guidance from the available tools toward selecting the best solution. EDA customers have responded to these shortcomings by demanding more route engine power, interactive functionality and diverse capabilities from their CAD tools. Currently, most users solve difficult routing problems interactively through a manual CAD editing environment according to a tedious manual process. Certain connections are selected, some portion of the path for these connections is routed, problems are located and resolved, and the process is iterated until done. Each connection may have a terminal associated therewith, which may be visually displayed as a pad to the designer. This pad may be associated with a pin, electrical connection, or the like. However, in light of the number of connections that a given design may include, the process of routing around such a large number of pads often becomes unruly and existing systems do not handle pad suppression in an efficient manner.

One existing approach to pad suppression is referred to as dynamic pad suppression. However, dynamic pad suppression prevents current routing technologies from being able to be utilized to route the designs as current routing technologies expect component pin pads to stay the same size throughout the entire routing process. Dynamic unused inner layer pad suppression techniques are designed to transition what has historically been a post-processing application to reduce capacitance effects at each hole site into the design database. Typically, the fabricator's computer-aided manufacturing ("CAM") department handled this application prior to film generation, and possibly the original equipment manufacturer ("OEM") removed the pads as a function of artwork generation. With the ever-increasing demand to make products smaller, lighter and cheaper, unused inner layer pads are being removed not only for electrical but also for physical effects. Removing pads increases higher routing densities by allowing traces to be closer to the hole edge.

Further, current methodologies for routing designs utilizing pad suppression are all manual. Accordingly, each time the user manually routes a connection that supports pad suppression, the suppressed pads on the layer are restored to their full regular size pad. The user manually makes the choice on which layers to route each connection in order to maximize the number of connections routed in the minimal real-estate. This is a slow and tedious process.

SUMMARY OF INVENTION

In one or more embodiments of the present disclosure, a computer-implemented method for routing in an electronic circuit design is provided. The method may include receiving, at one or more computing devices, the electronic circuit design having a plurality of terminal pads associated therewith. The method may further include generating a change in at least one of a size or an existence of at least one of the plurality of terminal pads. The method may also include routing a portion of the electronic design based upon, at least in part, the generated change.

One or more of the following features may be included. In some embodiments, routing may be performed automatically in response to receiving the electronic circuit design. Routing may include routing a single complete connection associated with the electronic design. Routing may also include routing a partial connection associated with the electronic design. Routing may further include routing a plurality of complete or partial connections associated with the electronic design. In some embodiments, one or more of the plurality of terminal pads may be of different sizes. The method may include performing a costing analysis on the portion of the electronic design prior to routing. In some embodiments, routing may include routing multiple connections associated with the electronic design, wherein at least one of the multiple connections are grouped as a flow or bundle.

In some embodiments, a computer-readable storage medium for electronic design simulation is provided. The computer-readable storage medium may have stored thereon instructions that when executed by a machine result in one or more operations. Operations may include receiving, at one or more computing devices, the electronic circuit design having a plurality of terminal pads associated therewith. Operations may further include generating a change in at least one of a size or an existence of at least one of the plurality of terminal pads. Operations may also include routing a portion of the electronic design based upon, at least in part, the generated change.

One or more of the following features may be included. In some embodiments, routing may be performed automatically in response to receiving the electronic circuit design. Routing may include routing a single complete connection associated with the electronic design. Routing may also include routing a partial connection associated with the electronic design. Routing may further include routing a plurality of complete or partial connections associated with the electronic design. In some embodiments, one or more of the plurality of terminal pads may be of different sizes. Operations may include performing a costing analysis on the portion of the electronic design prior to routing. In some embodiments, routing may include routing multiple connections associated with the electronic design, wherein at least one of the multiple connections are grouped as a flow or bundle.

In one or more embodiments of the present disclosure, a system may include a computing device having at least one processor configured to receive an electronic circuit design having a plurality of terminal pads associated therewith, the at least one processor further configured to generate a change in at least one of a size or an existence of at least one of the plurality of terminal pads, the at least one processor further configured to route a portion of the electronic design based upon, at least in part, the generated change.

One or more of the following features may be included. In some embodiments, routing may be performed automatically in response to receiving the electronic circuit design. Routing may include routing a single complete connection associated with the electronic design. Routing may also include routing a partial connection associated with the electronic design. Routing may further include routing a plurality of complete or partial connections associated with the electronic design. In some embodiments, one or more of the plurality of terminal pads may be of different sizes.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 7 is a schematic depicting aspects of the routing process in accordance with an embodiment of the present disclosure;

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Embodiments of the routing process described herein may utilize one or more electronic design automation techniques such as those available from the Assignee of the subject application. Additional information regarding routing, as it relates to electronic designs, may be found, for example, in U.S. Pat. No. 7,937,681; U.S. Pat. No. 8,479,138; U.S. Pat. No. 8,510,703; and U.S. Pat. No. 8,904,332, which are available from the Assignee of the subject application and which are each incorporated herein by reference in their entirety.

Figure 1:
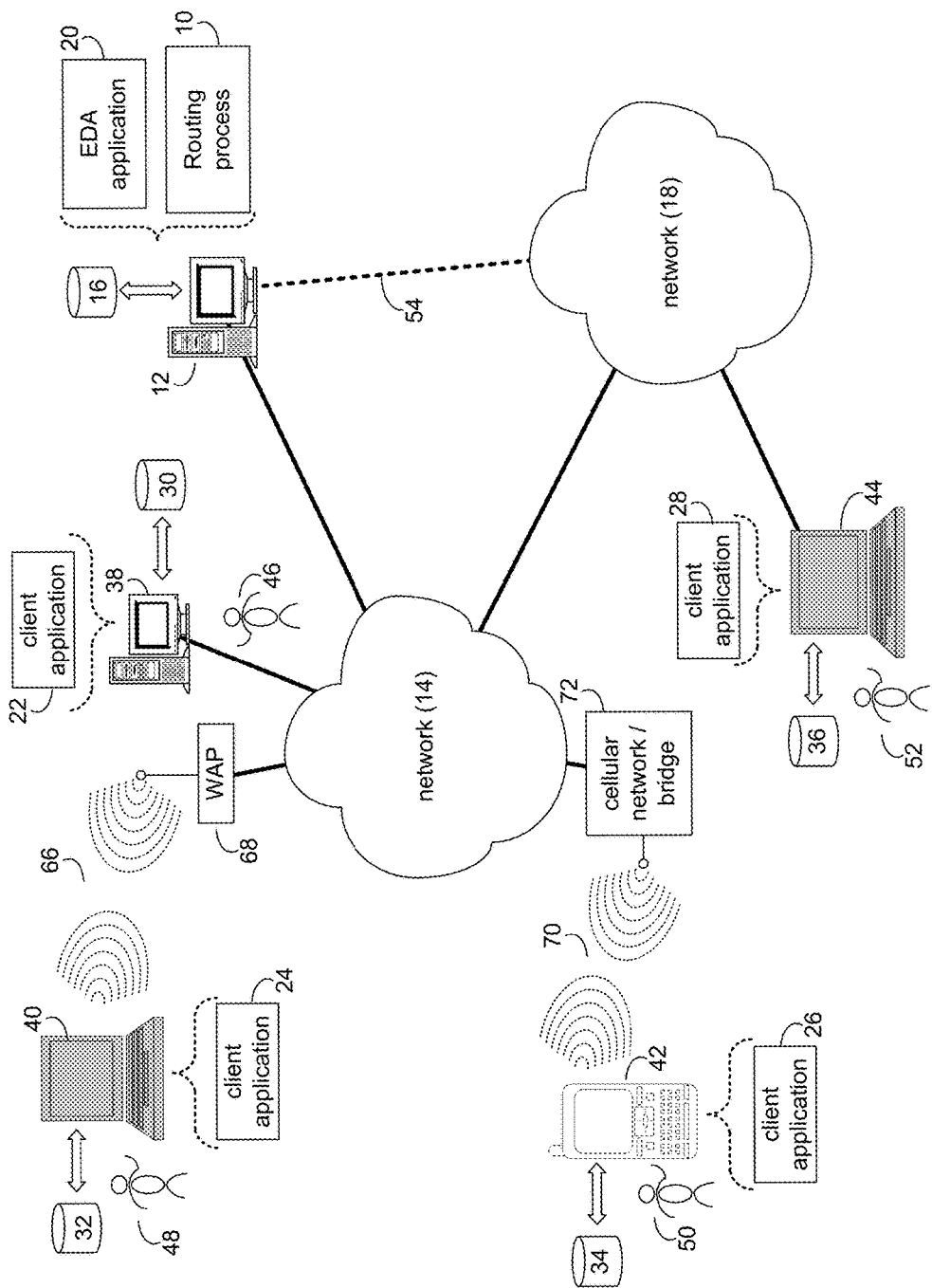
FIG. 1 is a system diagram depicting aspects of the routing process in accordance with an embodiment of the present disclosure.

Referring to FIG. 1, there is shown routing process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the routing process may reside on and be executed, in whole or in part, by a client electronic device, such as a personal computer, notebook computer, personal digital assistant, or the like.

The instruction sets and subroutines of routing process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for report generation. EDA application 20 may be referred to herein as a design tool.

Routing process 10 may be a stand alone application, or may be an applet/application/script that may interact with and/or be executed within EDA application 20. In addition/as an alternative to being a server-side process, the routing process may be a client-side process (not shown) that may reside on a client electronic device (described below) and may interact with an EDA client application (e.g., one or more of EDA client applications 22, 24, 26, 28). Further, the routing process may be a hybrid server-side/client-side process that may interact with EDA application 20 and an EDA client application (e.g., one or more of client applications 22, 24, 26, 28). As such, the routing process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize routing process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

As used herein, a "Design" may refer to aspects of an Electronic Design Automation (EDA) database of information, which may describe a Printed Circuit Board (PCB), an Integrated Circuit (IC), an IC Package, or any other suitable electronic device. A graphical representation of a portion of a Design is illustrated at 100 in FIGS. 2A-2B. A "Terminal" 105 may refer to a location on one or more layers of a Design to which electrical signals may be connected. For a PCB, Terminals may correspond to the pins, pads, and balls of the elements in the circuit. For an IC Package, Terminals are typically IC bumps or package balls. A Terminal may also be a junction point, such as a via, virtual pin or a T-junction. Multiple Terminals that are grouped together, such as depicted at 110, will be referred to as a "Component".

Figure 2A:
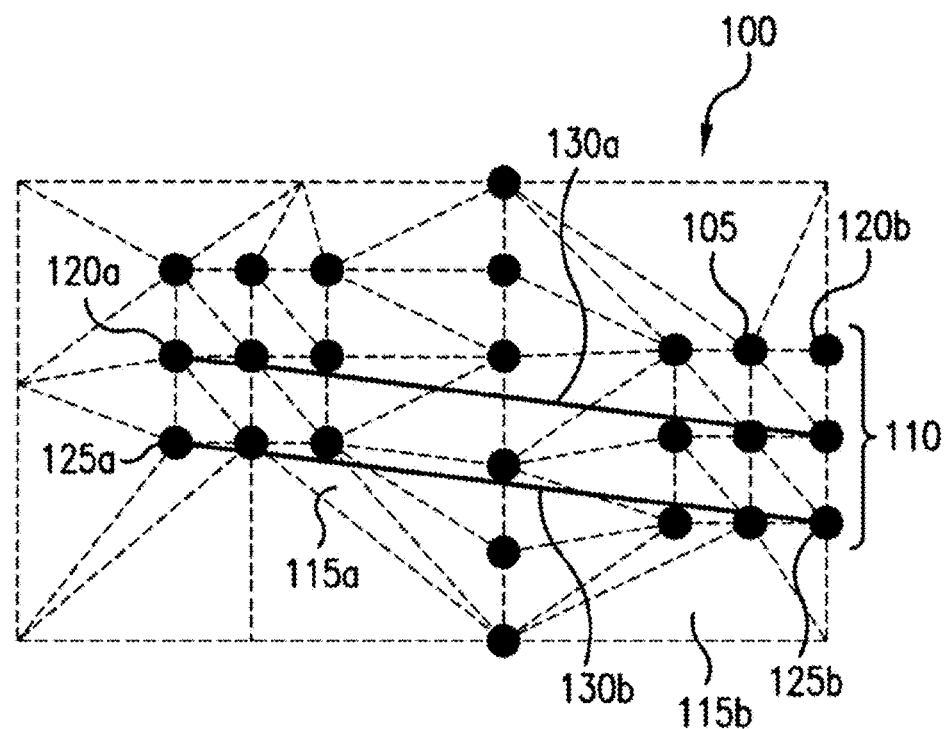
FIGS. 2A and 2B show schematics depicting aspects of the routing process in accordance with an embodiment of the present disclosure.
Figure 2B:
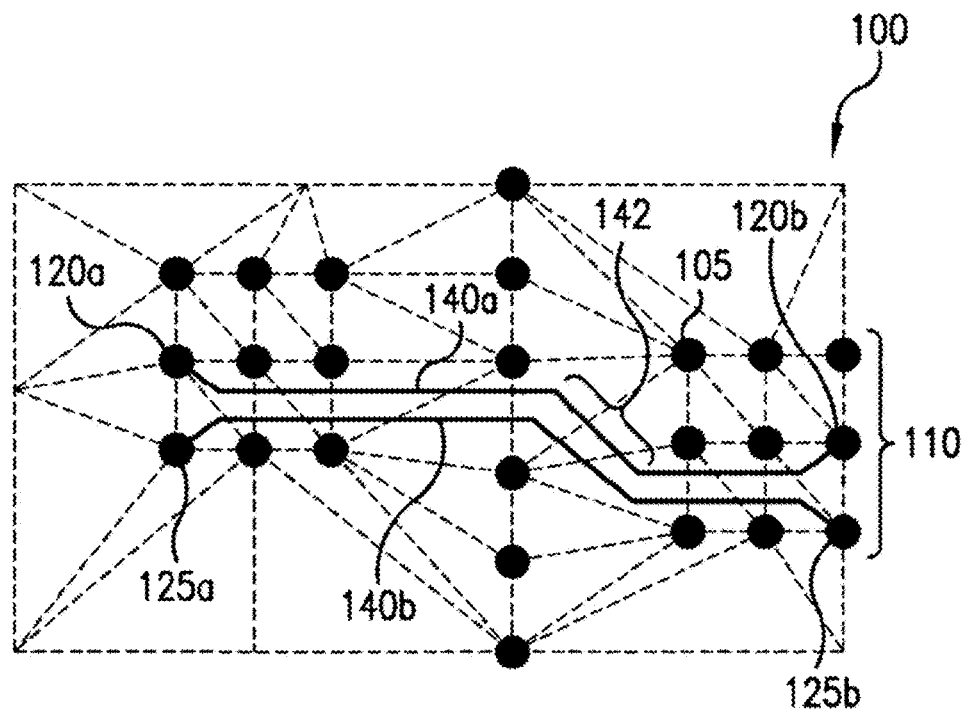

In FIGS. 2A-2B, there is shown a "Tessellation" of Design 100, e.g., the separation of the entire design space into distinct, non-overlapping regions, such as those shown at 115*a* and 115*b*. The regions in the example embodiments described herein are triangular, but it is to be understood that the regions may be formed of other polygonal shapes, such as the rectangular regions of tessellation employed in traditional autorouters.

As used herein, the term "Rat" may refer to a connection between two Terminals, e.g., a "Source Terminal" 120*a*, 125*a* and a "Target Terminal" 120*b*, 125*b*. A Rat may be unrouted, as shown at 130*a*, 130*b* of FIG. 2A, where the Rat has yet to possess geometric information defining its precise path in the Design, or a Rat can be routed as shown at 140*a*, 140*b* of FIG. 2B, where the Rat has complete geometric information specifying its ordered sequence of "Segments", an example of which is shown at 142. The Segment ordering is typically indexed or referenced starting at the Source Terminal 120*a*, 125*a* and ending at the Target Terminal 120*b*, 125*b*.

As used herein, the term "Net" may refer to a collection of Rats connecting a collection of Terminals. In some cases, the specific connections between Terminals formed by certain Rats are predetermined. In other cases, the Rats may be assembled into a Net in an order or "sequence" that is either established by the autorouter or is constrained by certain rules. For example, in the absence of any connectivity rules, the autorouter can change the collection of Rats as needed, provided the new collection still connects all of the Terminals of the Net.

Figure 3:
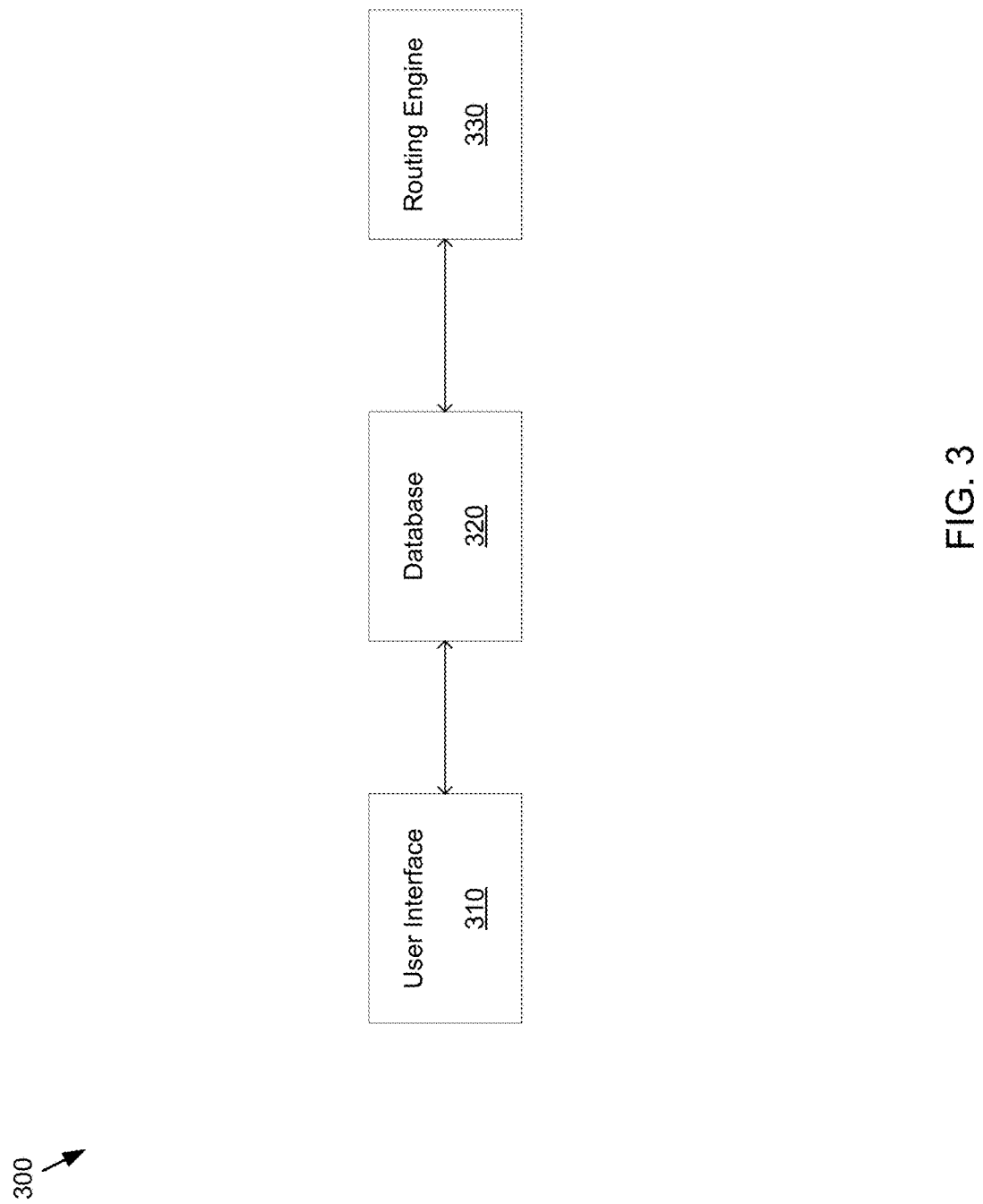
FIG. 3 is a schematic depicting aspects of the routing process in accordance with an embodiment of the present disclosure.
Figure 4:
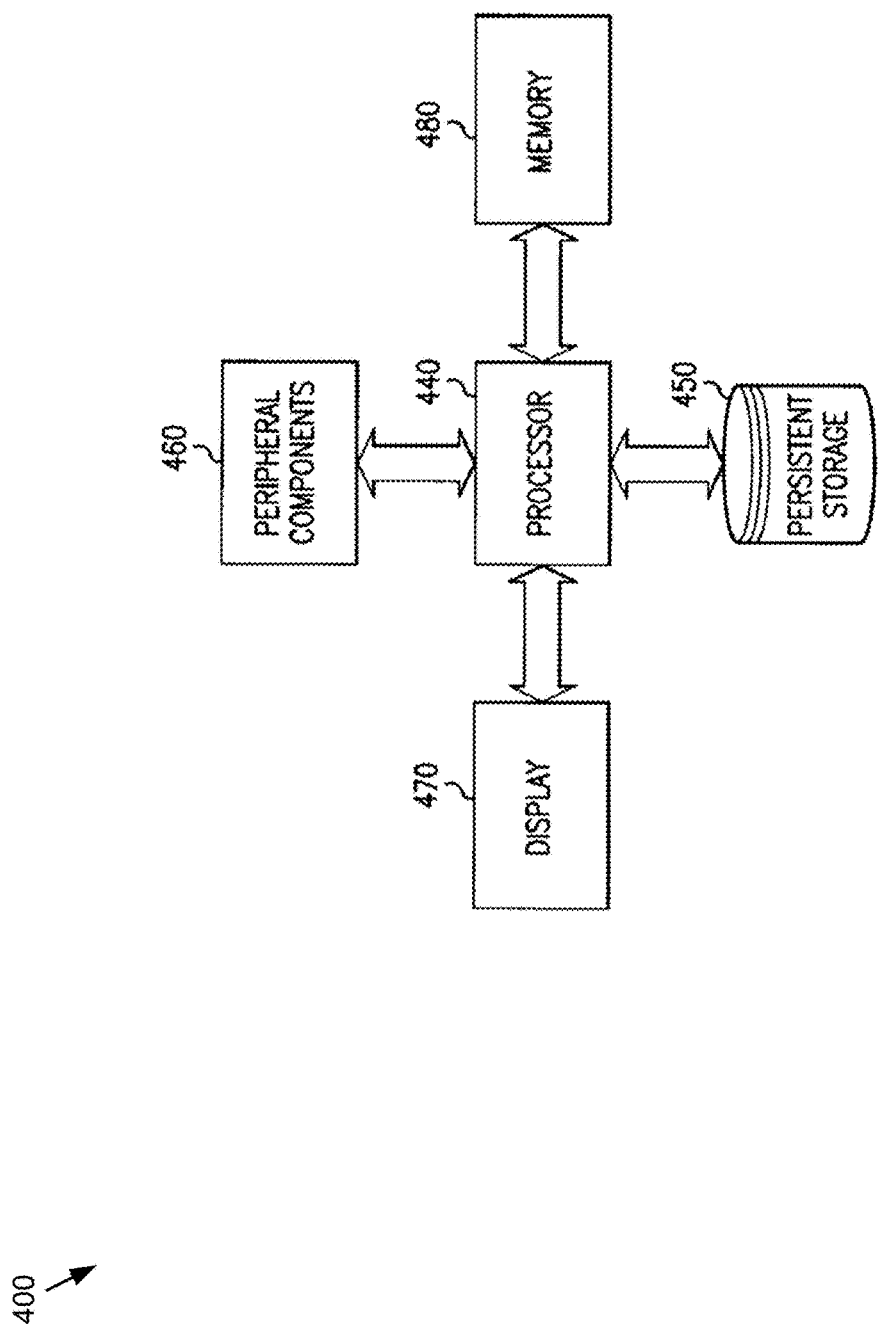
FIG. 4 is a schematic depicting aspects of the routing process in accordance with an embodiment of the present disclosure.

An example embodiment depicting functional modules operable to carry out the present disclosure are illustrated in FIG. 3 and may be implemented in suitable computing hardware such as that depicted in FIG. 4. The data defining one or more Designs may be maintained in database 320 and may be presented to a user as one or more abstractions of that data through a user interface 310. A data abstraction may refer to a conceptualization of the data reduced or factored so that a user can focus on only few pertinent aspects thereof. This may be useful in circuit design in that the data may be viewed in a manner appropriate to the work task at hand. For example, an IC is generally viewed by a simple block symbol during a Component placement task and is viewed as an arrangement of its Terminals in a routing task. Through these data abstractions, the user may be relieved of having to place and route the circuit in a view cluttered by the IC's constituent components, i.e., the thousands and possibly millions of transistors, resistors and other circuit elements forming the IC.

Database 320 implements a suitable structure on, for example, persistent storage system 450, for retaining data so as to be retrieved by its numerous data abstractions. Additionally, the database 320 is operable to store data that has been modified through any of its abstractions.

User interface 410 may be implemented through processor instructions stored in memory system 480 and executed by a suitable processor 440. User interface 410 may be a graphical user interface operable to display the Design on a display 470 and to allow the user to add, delete and modify features of the Design through, for example, manipulation of certain peripheral components 460 coupled to processor 440.

Routing engine 330 may execute path finding procedures to interconnect the Terminals of a Design. Routing engine 330 may be implemented through processor instructions stored in memory system 480 and executable by processor 440. The present disclosure is not limited to any specific router implementation.

Figure 5:
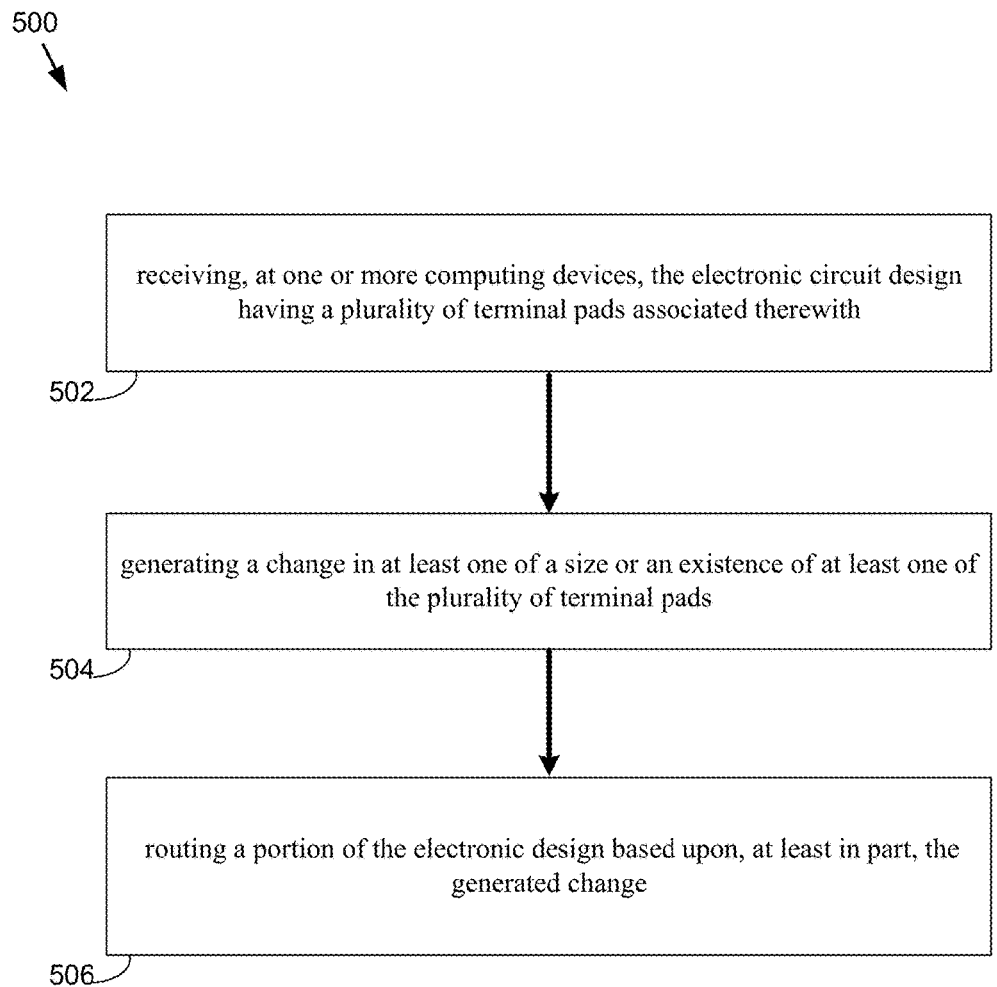
FIG. 5 is a flowchart depicting operations consistent with the routing process of the present disclosure.

As shown in FIG. 5, and as will be discussed in further detail below, routing process 10, 500 may include receiving (502), at one or more computing devices, the electronic circuit design having a plurality of terminal pads associated therewith. Embodiments may further include generating (504) a change in at least one of a size or an existence of at least one of the plurality of terminal pads. Embodiments may also include routing (506) a portion of the electronic design based upon, at least in part, the generated change.

As discussed above with reference to FIGS. 2A-2B, each terminal may correspond to the pins, pads, balls, etc of the element in a particular circuit. FIGS. 6-20 depict various embodiments of graphical user interfaces ("GUIs") associated with routing process 10. These GUIs depict terminals having visible pads, suppressed pads, and combinations thereof.

Figure 6:
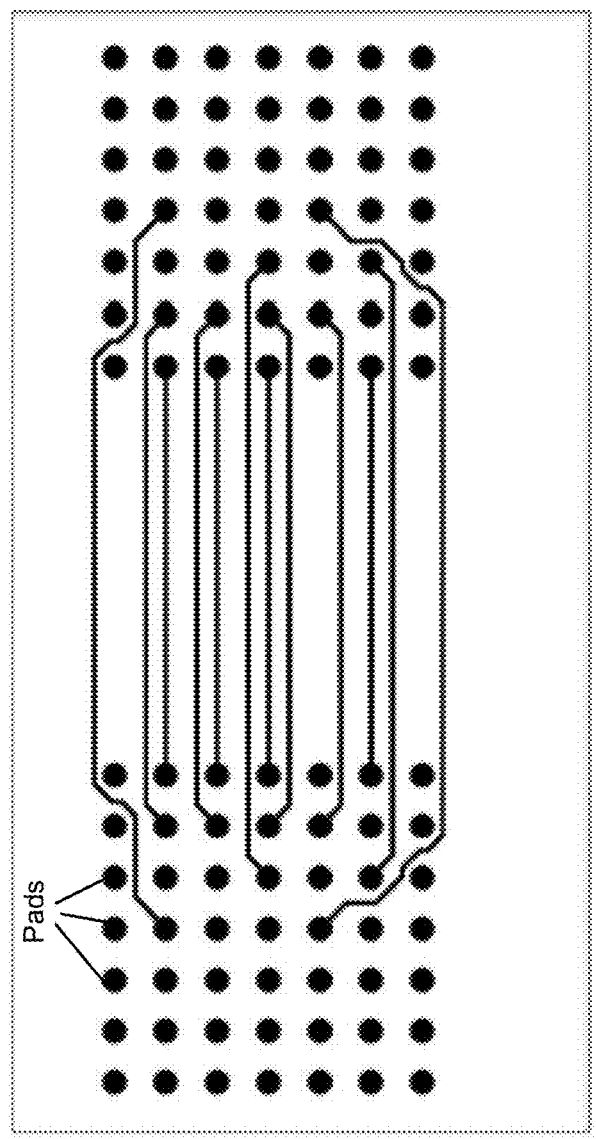
FIG. 6 is a schematic depicting aspects of the routing process in accordance with an embodiment of the present disclosure.

Referring now to FIGS. 6-7, diagrams 600 and 700 depicting examples of hand routing in an electronic design are provided. As design density and component pin counts continue to increase, locating available real-estate for tracks becomes more challenging. FIGS. 6-7 show an example of hand routing of a design with no pad suppression. FIG. 6 depicts a first inner layer having no pad suppression and FIG. 7 depicts a second inner layer having no pad suppression.

Figure 8:
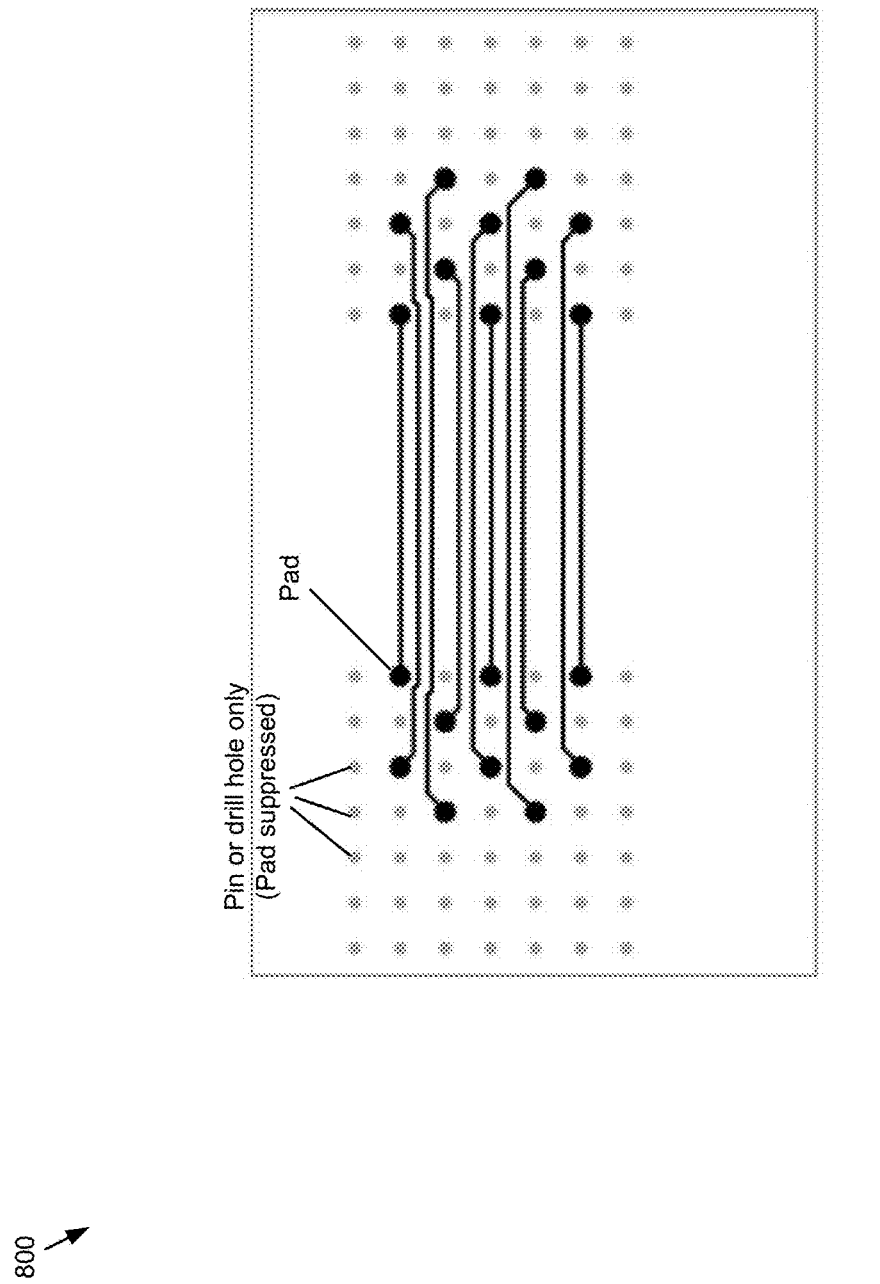
FIG. 8 is a schematic depicting aspects of the routing process in accordance with an embodiment of the present disclosure.
Figure 9:
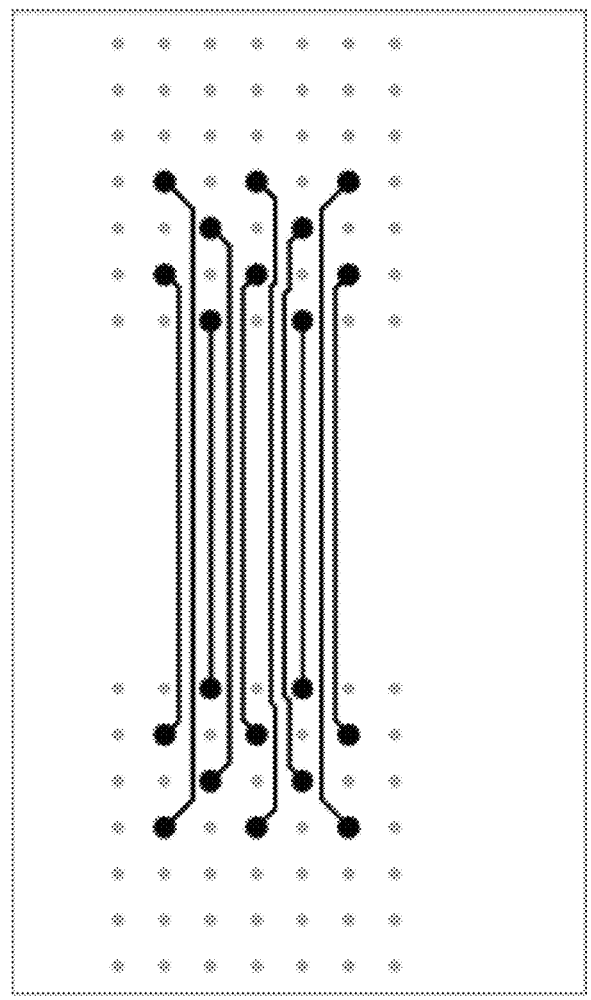
FIG. 9 is a schematic depicting aspects of the routing process in accordance with an embodiment of the present disclosure.

In some embodiments, routing process 10 may be configured to suppress or reduce the size of unconnected pads on internal layers, which may provide additional track real-estate. FIGS. 8-9 show the same design as in FIGS. 6-7, however, these embodiments depict hand routing with the unused pads suppressed (e.g., only the pin or drill hole is visible). As discussed above, performing manual routing is an extremely slow and tedious process.

Embodiments of routing process 10 may extend current routing algorithms to understand new costing concepts that represent the effects of dynamically changing pads. Existing routing approaches often utilize some type of costing to find the best paths for each connection on the design. Beyond this basic principle, they may differ in how they implement the costing including how many and what type of costs are used. Some costing methodologies include, but are not limited to, clearance and cross. Additional information regarding costing methodologies as well as various costing techniques may be found, for example, in U.S. Pat. No. 8,510,703, which is hereby incorporated by reference in its entirety.

As used herein, the term "probe" may refer to an item that represents a possible next path between objects. The term "seeding" may refer to the process of creating entry and exit vehicles from an existing pad. The phrase "automatically routing" may refer to an algorithmically generated or computer-generated routing, which may include a programmed response based upon one or more computer-implemented operations.

Figure 10:
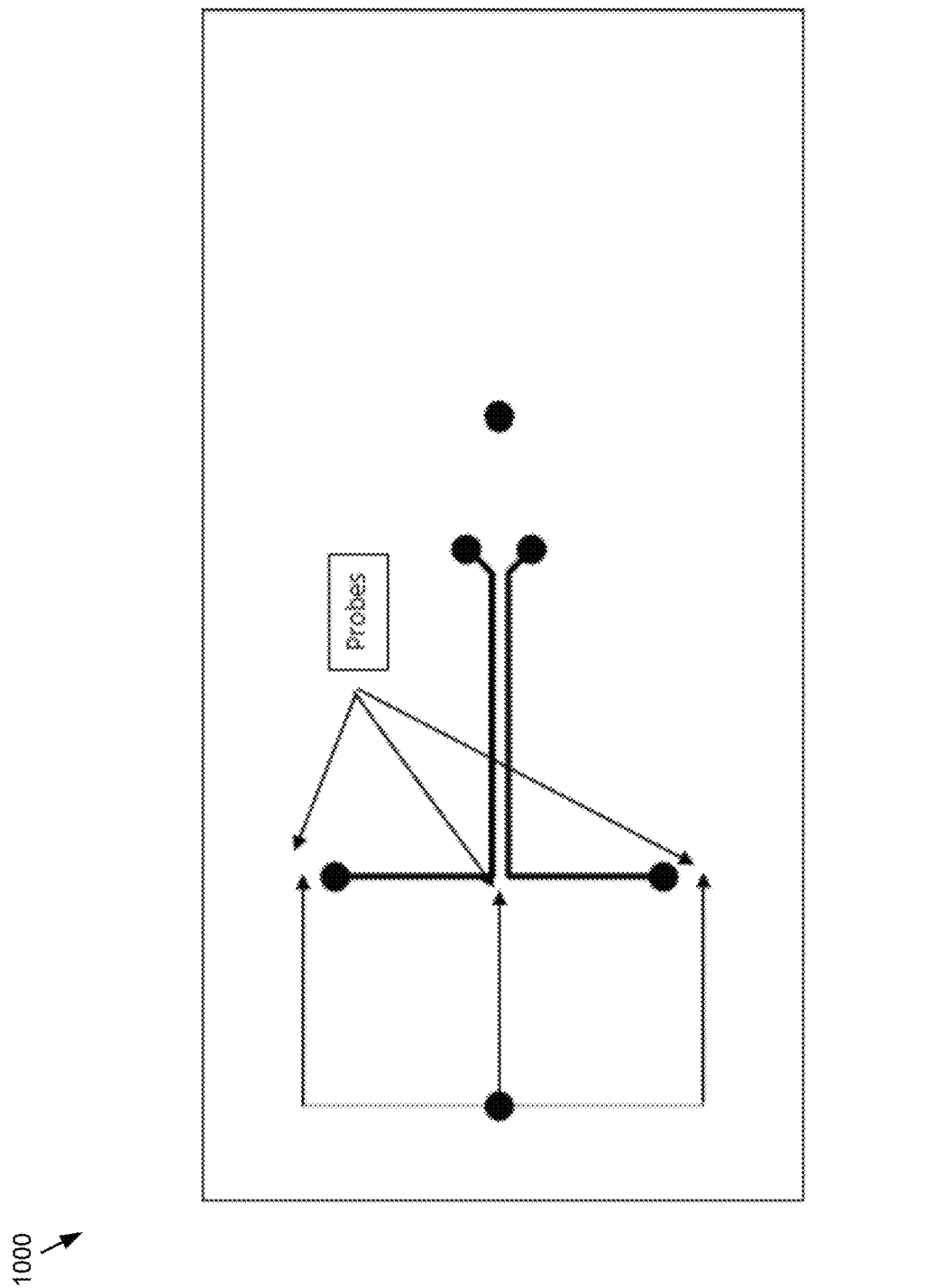
FIG. 10 is a schematic depicting aspects of the routing process in accordance with an embodiment of the present disclosure.
Figure 11:
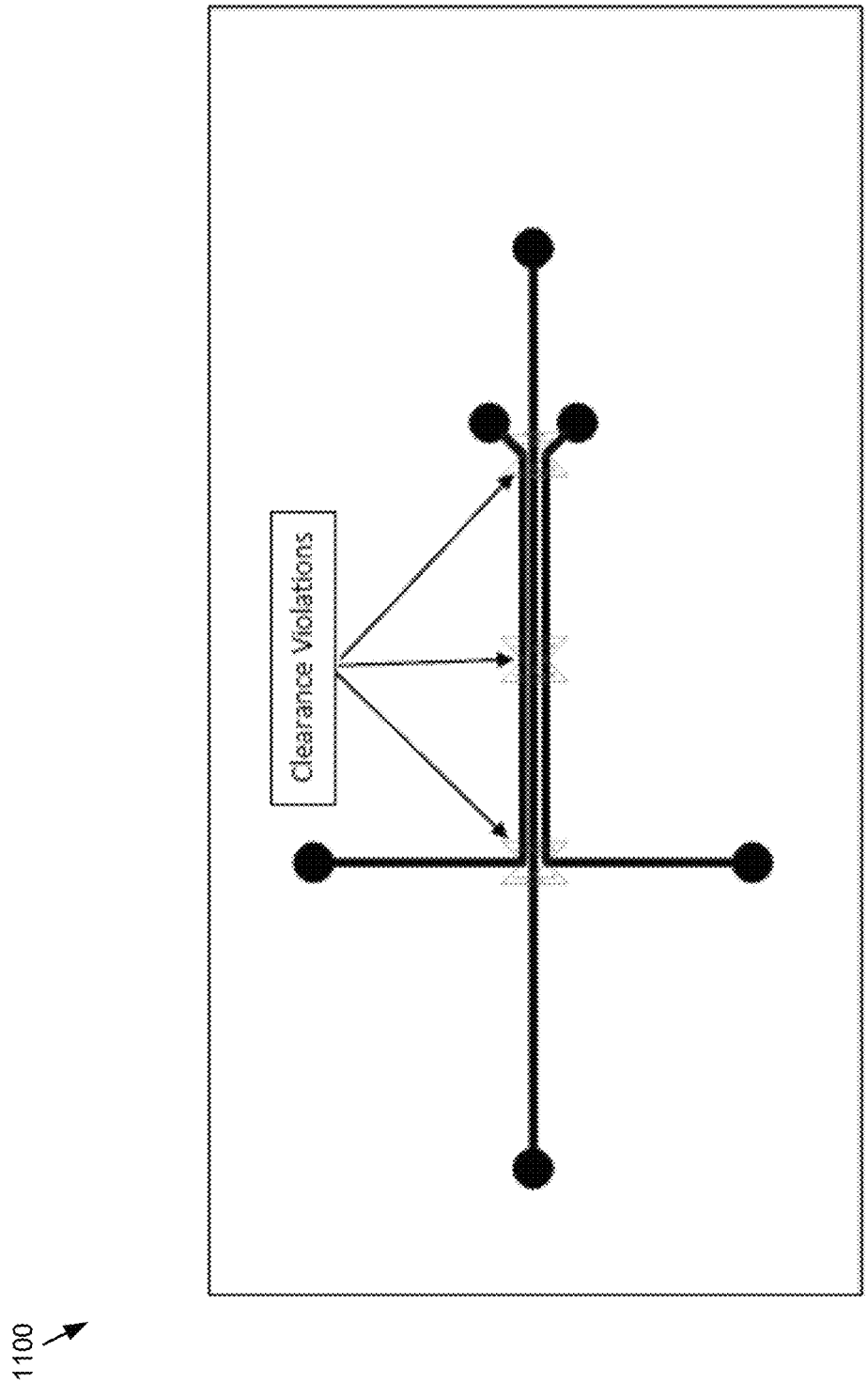
FIG. 11 is a schematic depicting aspects of the routing process in accordance with an embodiment of the present disclosure.

Existing Global Route Environment ("GRE") clearance cost is a value added to the total cost when a probe is attempting to route between existing items that have insufficient space. FIG. 10 depicts probes attempting to go between existing tracks and pads. At least one of the tracks the probe is attempting to go between has to be movable or allowed to be removed for the probe to succeed. If this condition is met, the probe may be allowed to pass between them at a cost. In this case, the cost to go between was less than the cost to go around since FIG. 11 shows the final path was between. The new track is applied with clearance violations that may need to be resolved during additional routing steps.

Figure 12:
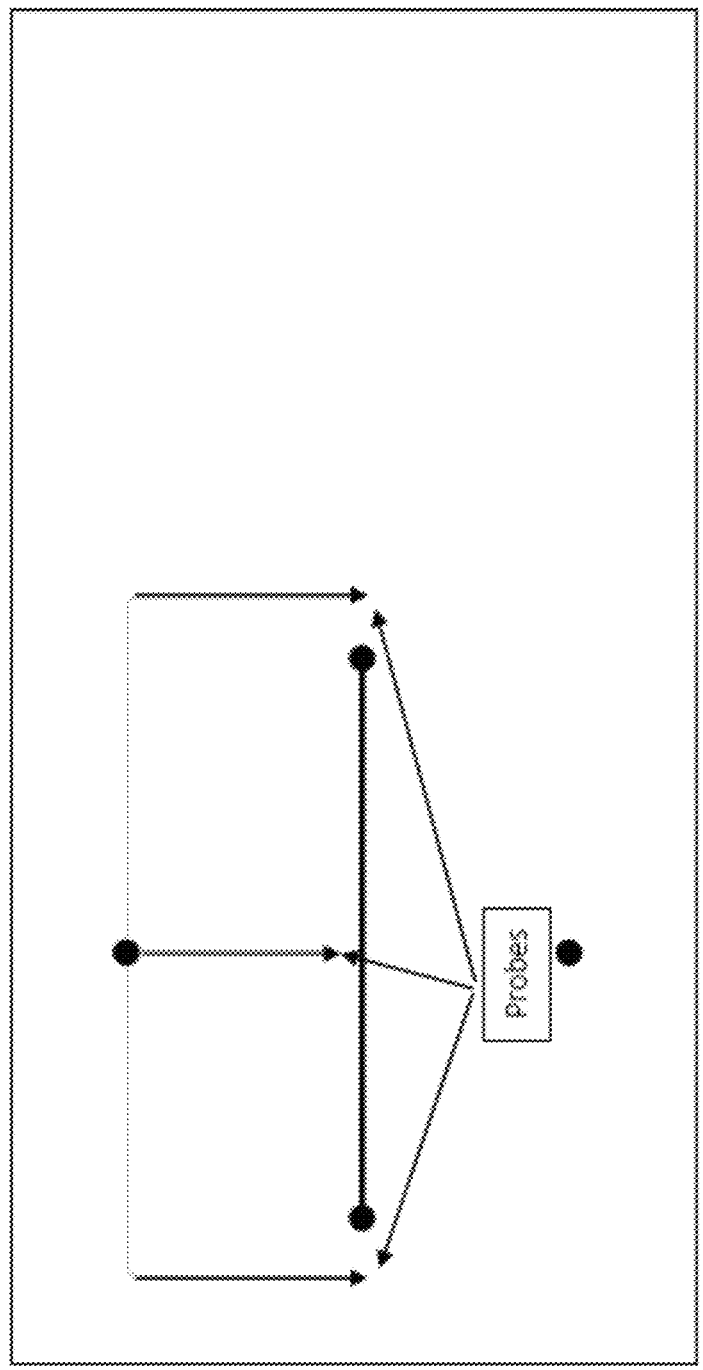
FIG. 12 is a schematic depicting aspects of the routing process in accordance with an embodiment of the present disclosure.
Figure 13:
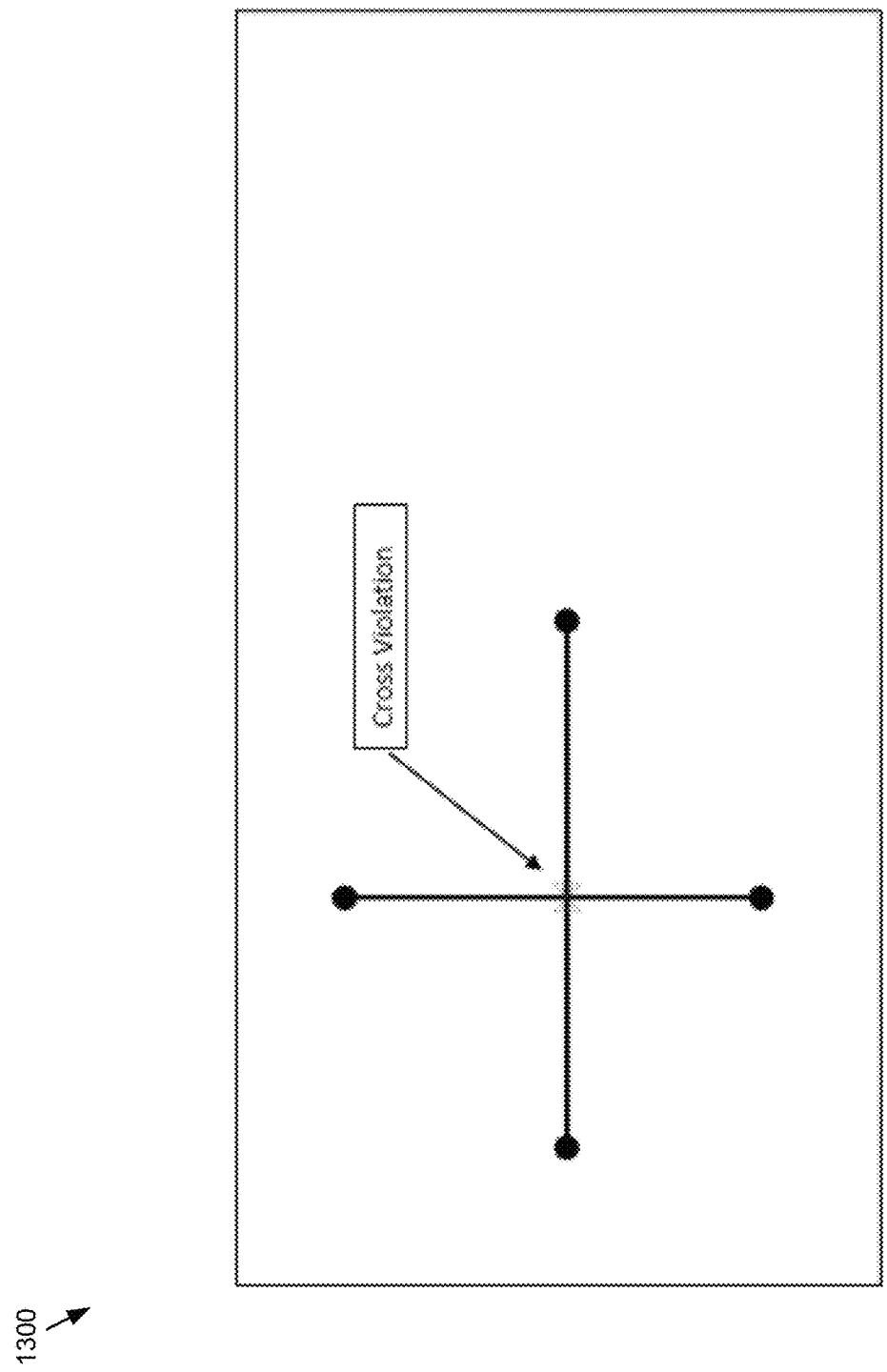
FIG. 13 is a schematic depicting aspects of the routing process in accordance with an embodiment of the present disclosure.
Figure 14:
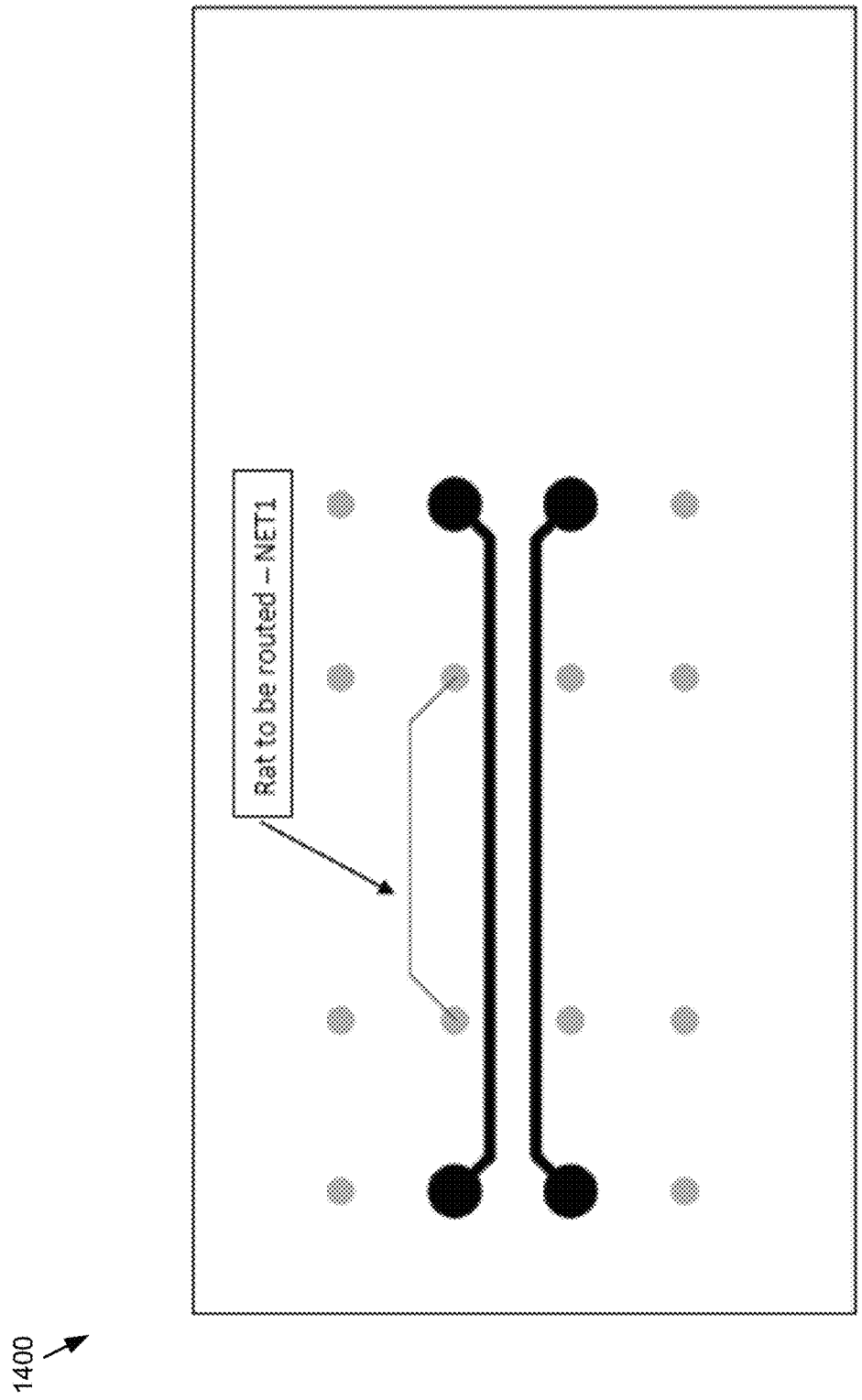
FIG. 14 is a schematic depicting aspects of the routing process in accordance with an embodiment of the present disclosure.

Existing GRE cross cost is a value added to the total cost when a probe is attempting to route over an existing item. In FIG. 12, probes are sent out to go around and to go over an existing connection. The track the probe is attempting to go over must be movable or removable. For the purpose of this example, it was cheaper to cross over the existing track than it was to go around. FIG. 13 shows the resulting connection crossing over the existing connection. The cross violation may need to be resolved during additional routing steps.

Figure 15:
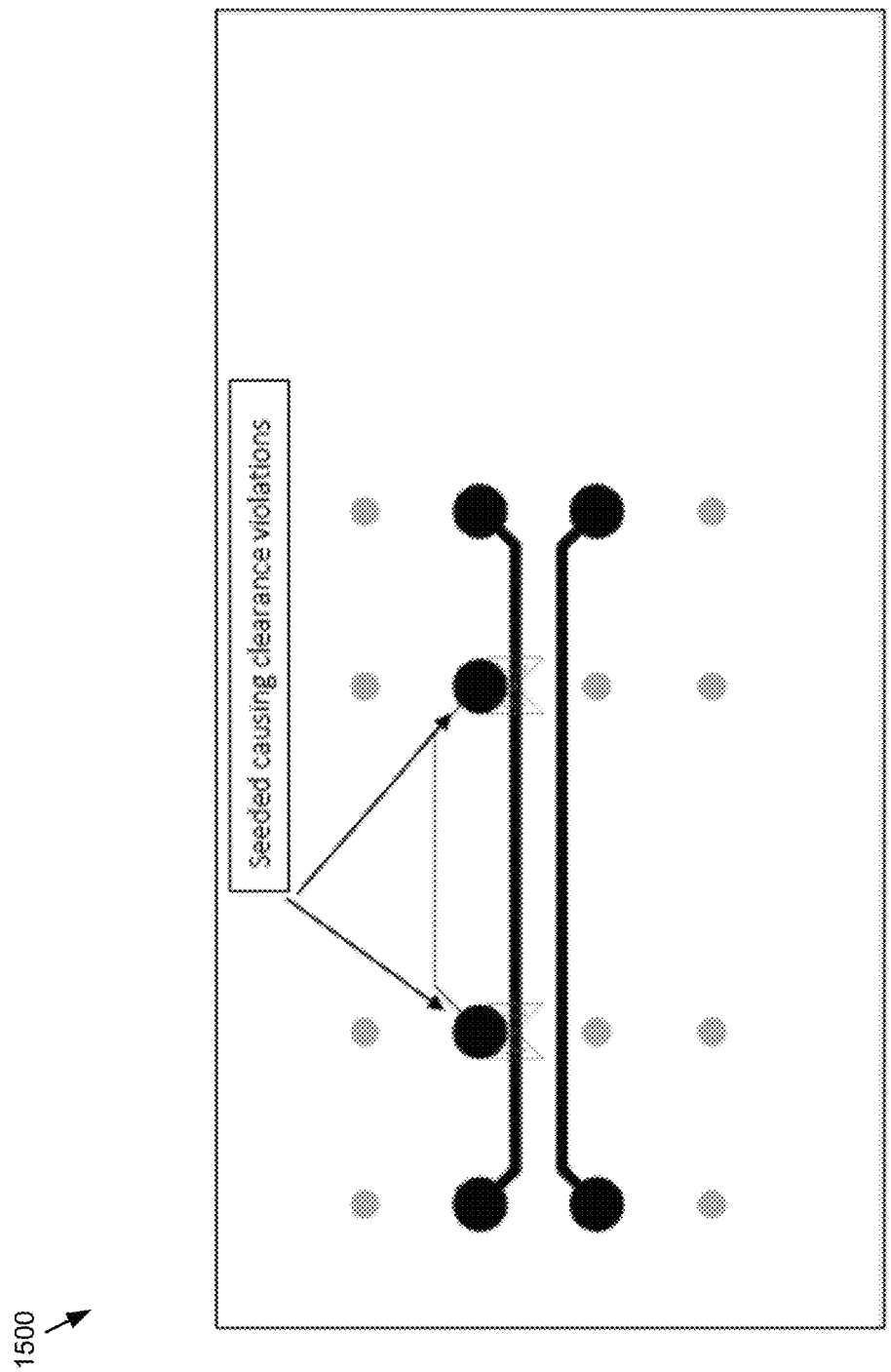
FIG. 15 is a schematic depicting aspects of the routing process in accordance with an embodiment of the present disclosure.
Figure 16:
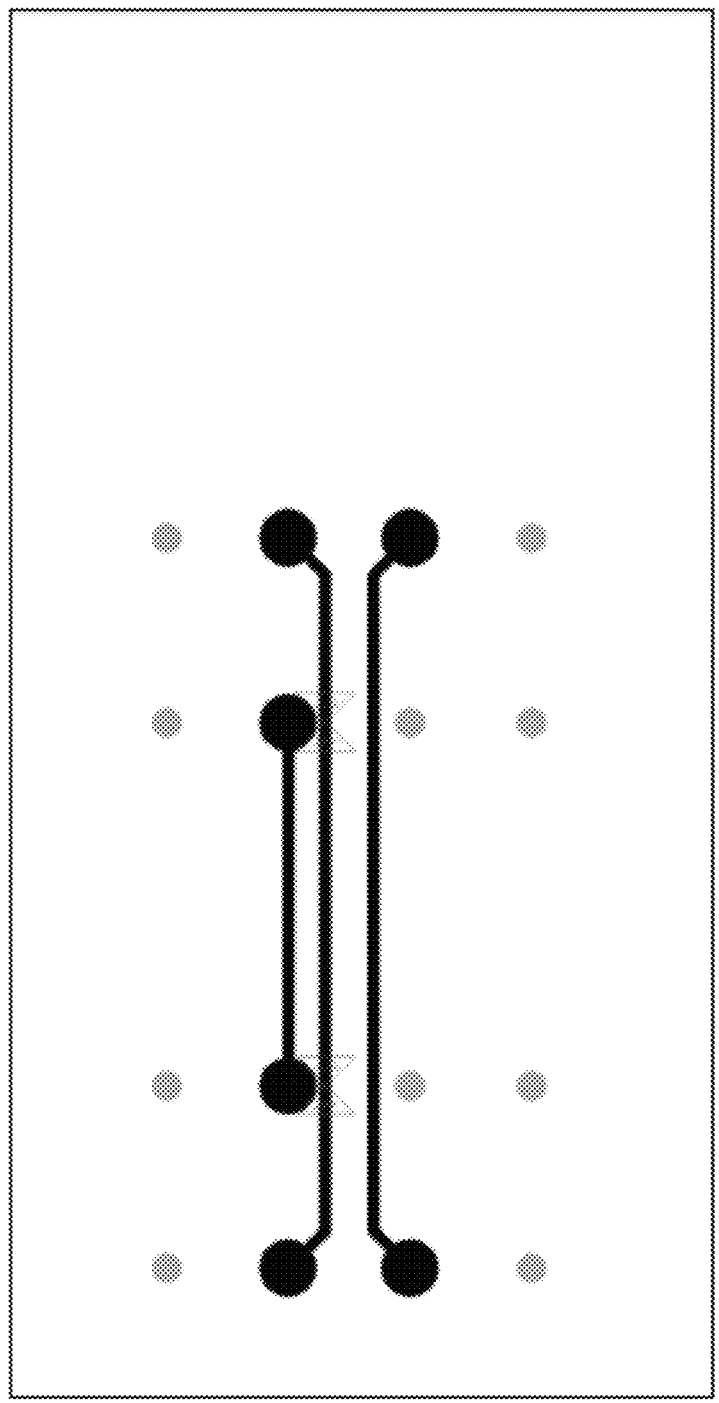
FIG. 16 is a schematic depicting aspects of the routing process in accordance with an embodiment of the present disclosure.

Embodiments of routing process 10 may support dynamically changing pad shapes and sizes. Accordingly, routing process 10 may be configured to extend the GRE clearance cost to understand the effects of the changing pad size during seeding. Notice in FIG. 14, the pads for NET1 are smaller because there is no connection to them. When the router seeds the pad, it expands the size of the pad to that of a connected pad as is shown in FIG. 15. During this process, it would verify that the track or tracks that will be in conflict are movable or removable and then add an incremental cost to route on this layer. The connection would be applied with clearance violations that would be resolved in future routing steps as is shown in FIG. 16.

Figure 17:
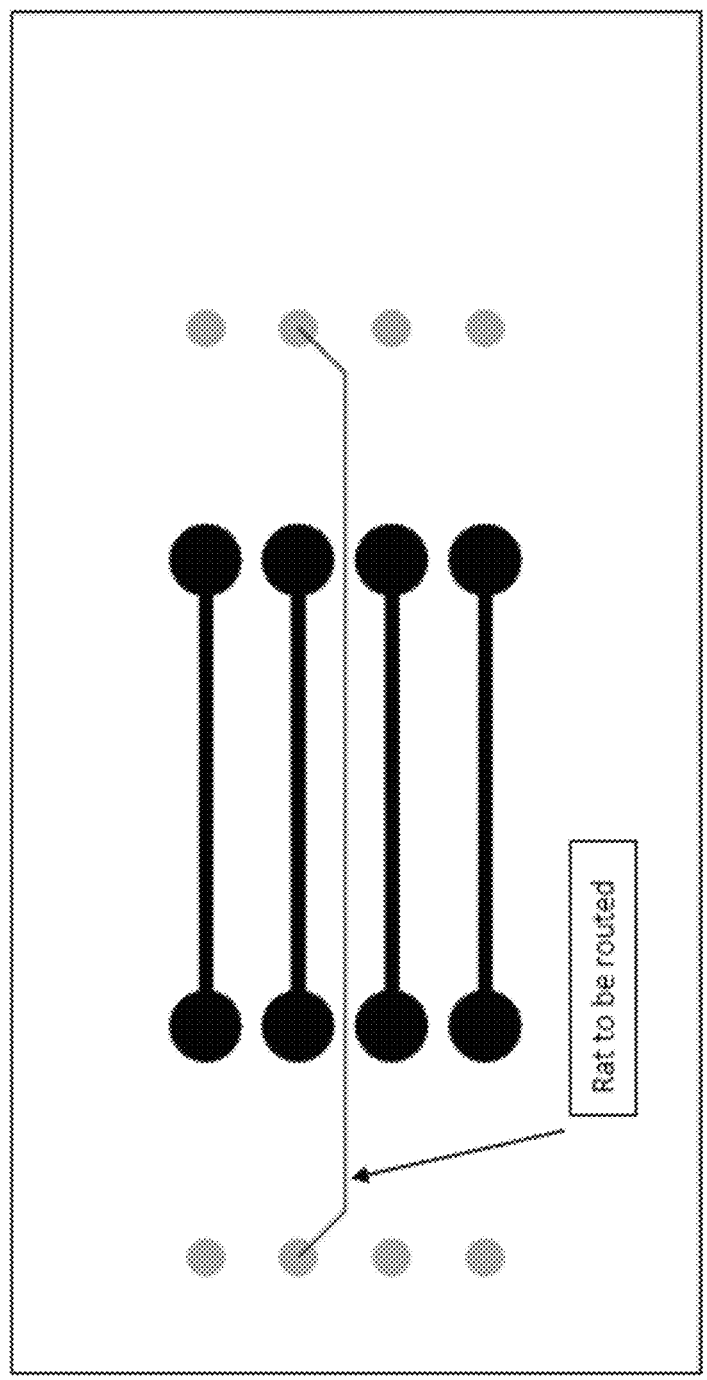
FIG. 17 is a schematic depicting aspects of the routing process in accordance with an embodiment of the present disclosure.
Figure 18:
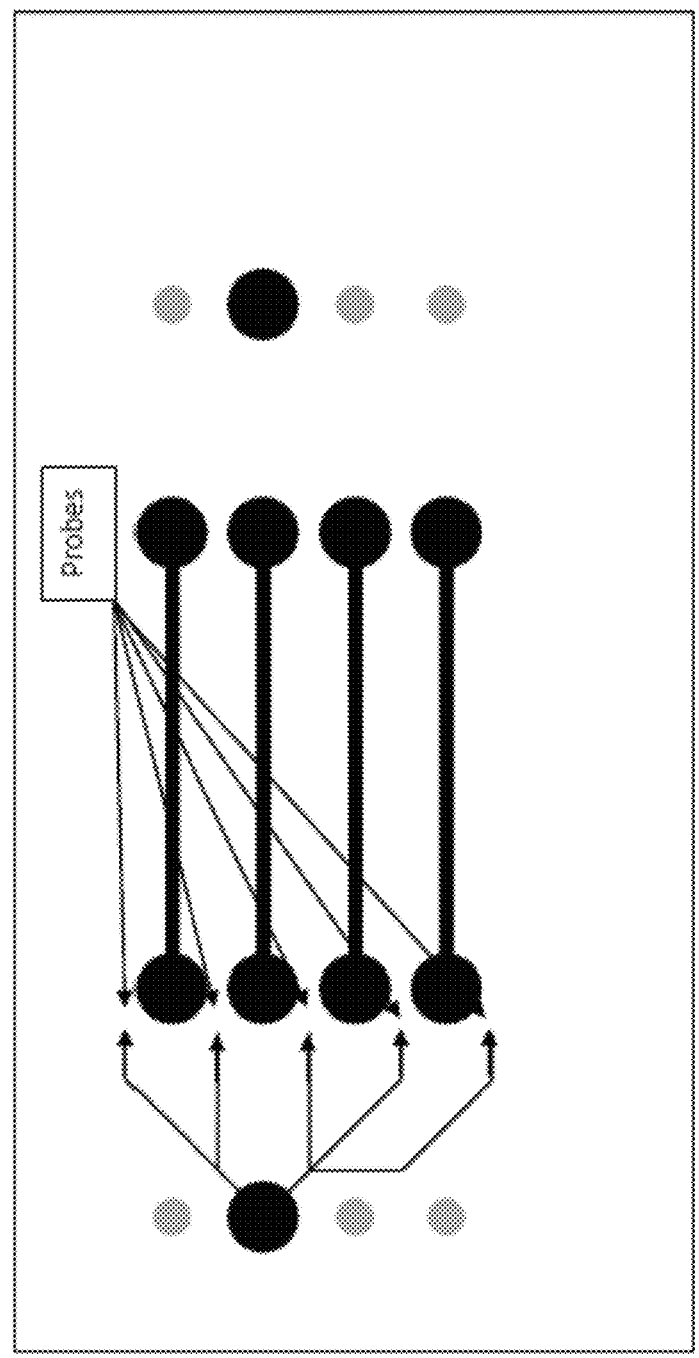
FIG. 18 is a schematic depicting aspects of the routing process in accordance with an embodiment of the present disclosure.
Figure 19:
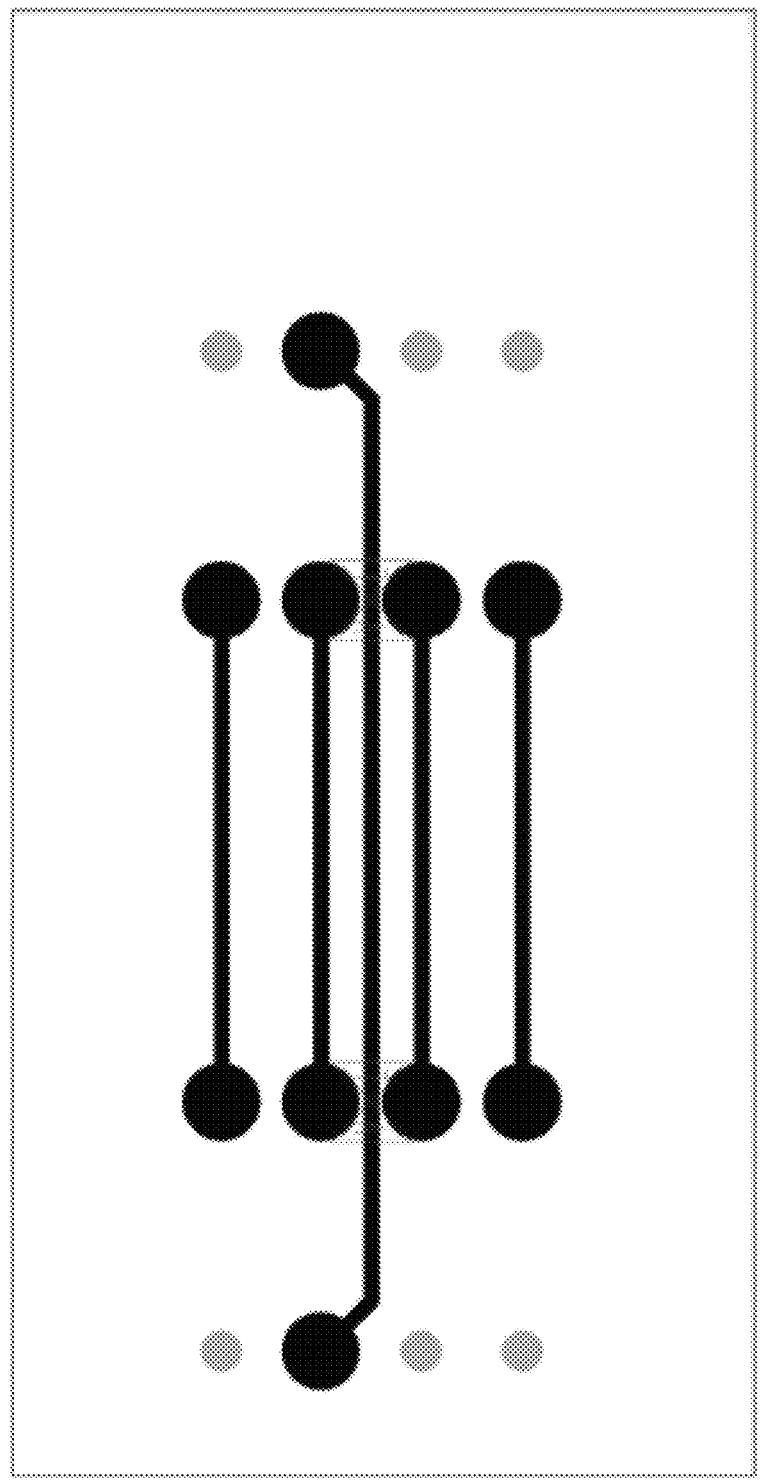
FIG. 19 is a schematic depicting aspects of the routing process in accordance with an embodiment of the present disclosure.

FIG. 17 depicts an example where 4 routes are on the same layer and a proposed rat is attempting to go between two of the connections. Extend the GRE clearance cost to understand the effects of a probe attempting to route between existing items that have insufficient space but could gain additional space if a pad or pads were suppressed as is shown in FIG. 18. FIG. 19 depicts the new route succeeded, however clearance violations are present.

Figure 20:
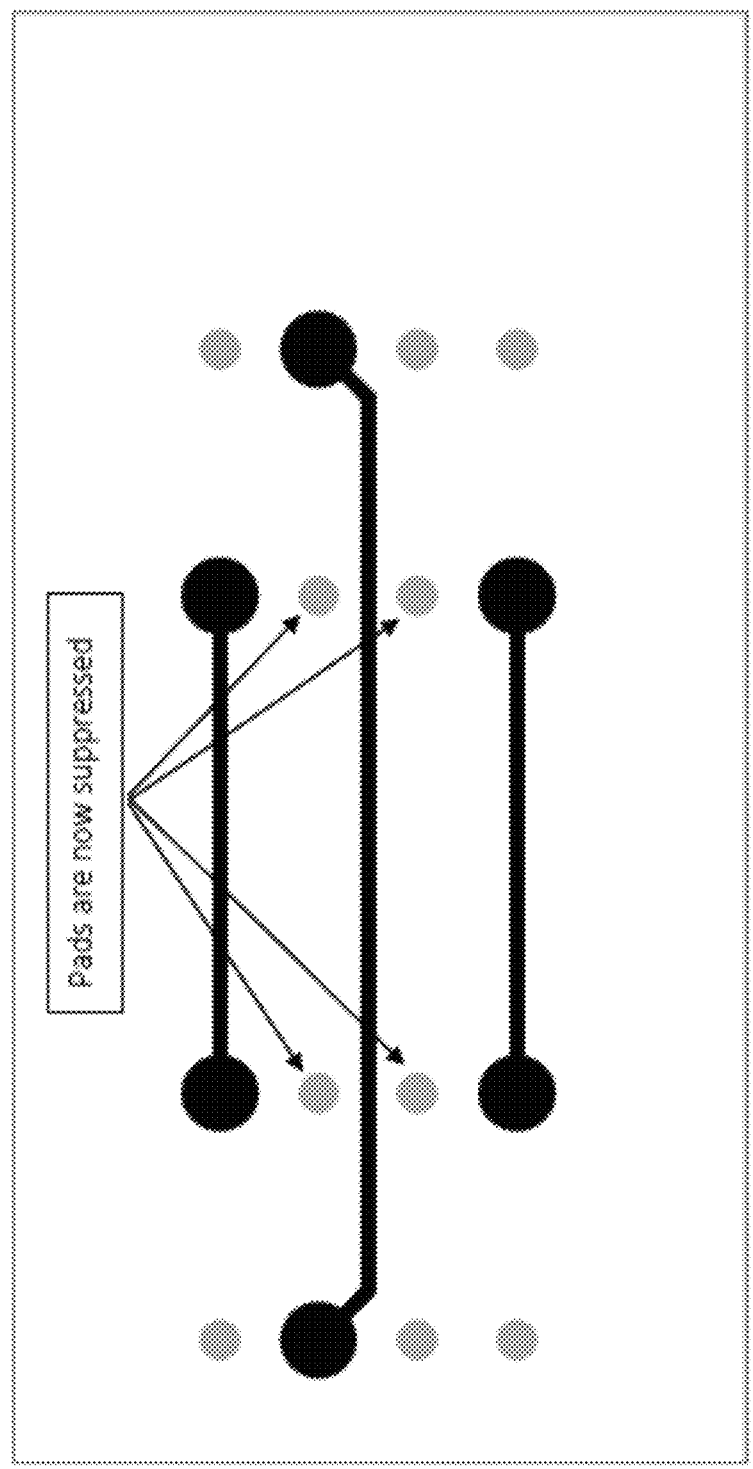
FIG. 20 is a schematic depicting aspects of the routing process in accordance with an embodiment of the present disclosure.
Figure 21:
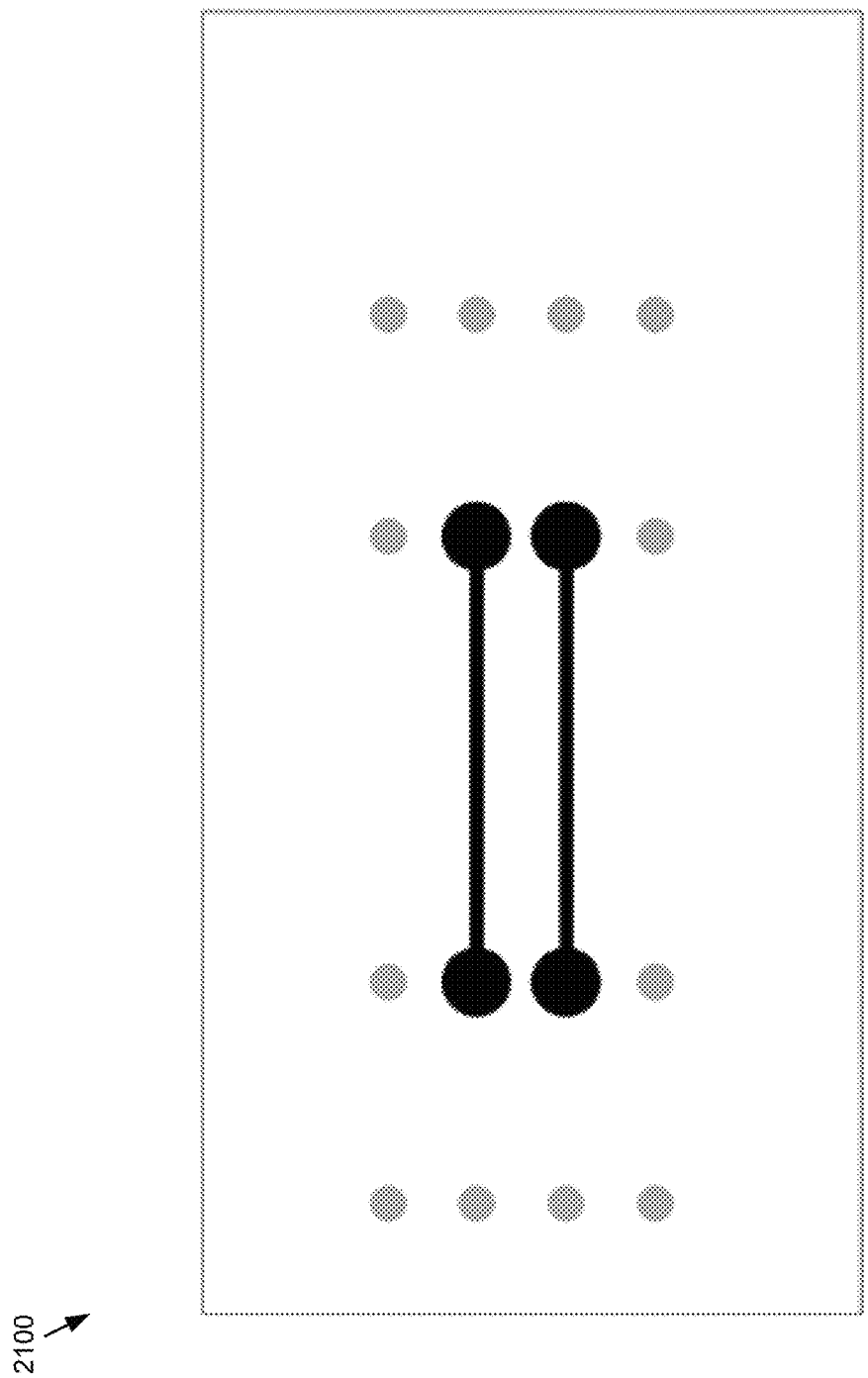
FIG. 21 is a schematic depicting aspects of the routing process in accordance with an embodiment of the present disclosure.

Referring now to FIGS. 20-21, schematics consistent with embodiments of routing process 10 are provided. FIG. 20 shows a completed layer 1 routing after a re-route of existing connections has been performed. Similarly, FIG. 21 shows a completed layer 2 routing after a re-route of existing connections. The two connections with violations rerouted onto layer 2 are shown in FIG. 21. Notice in FIG. 20, the pads on layer 1 for the connections that got rerouted to layer 2 have been suppressed. FIG. 21 depicts an example showing a completed layer 2 routing after a re-route of existing connections.

Figure 22:
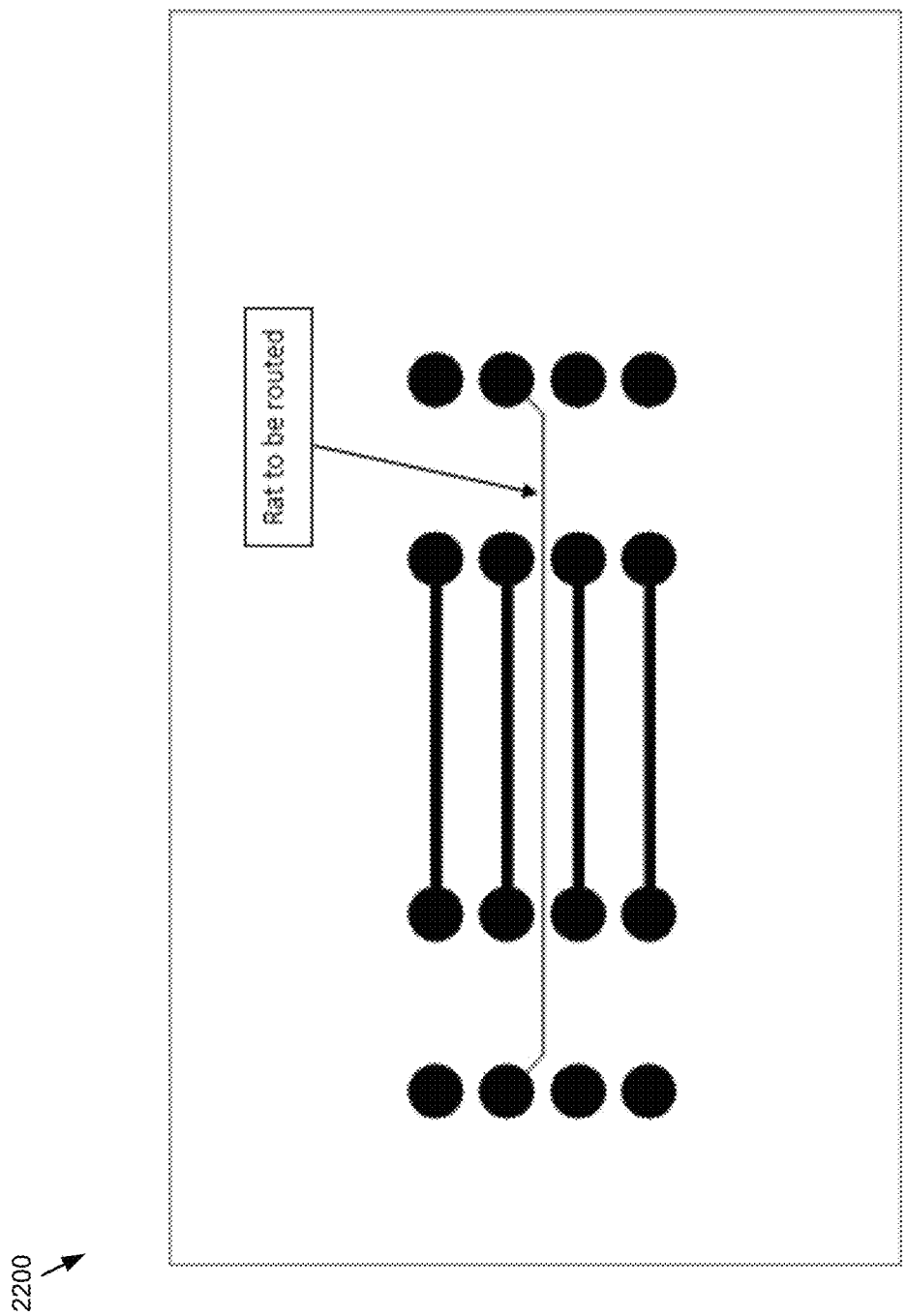
FIG. 22 is a schematic depicting aspects of the routing process in accordance with an embodiment of the present disclosure.
Figure 23:
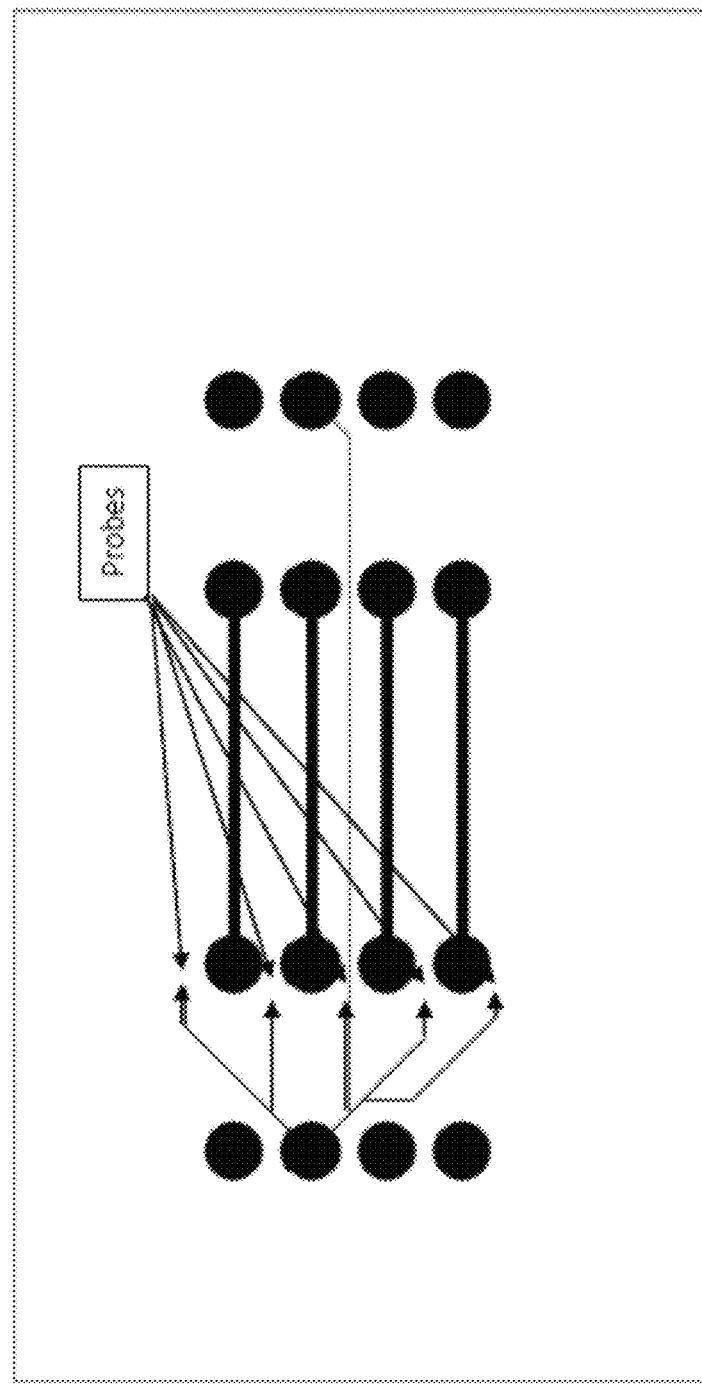
FIG. 23 is a schematic depicting aspects of the routing process in accordance with an embodiment of the present disclosure.
Figure 24:
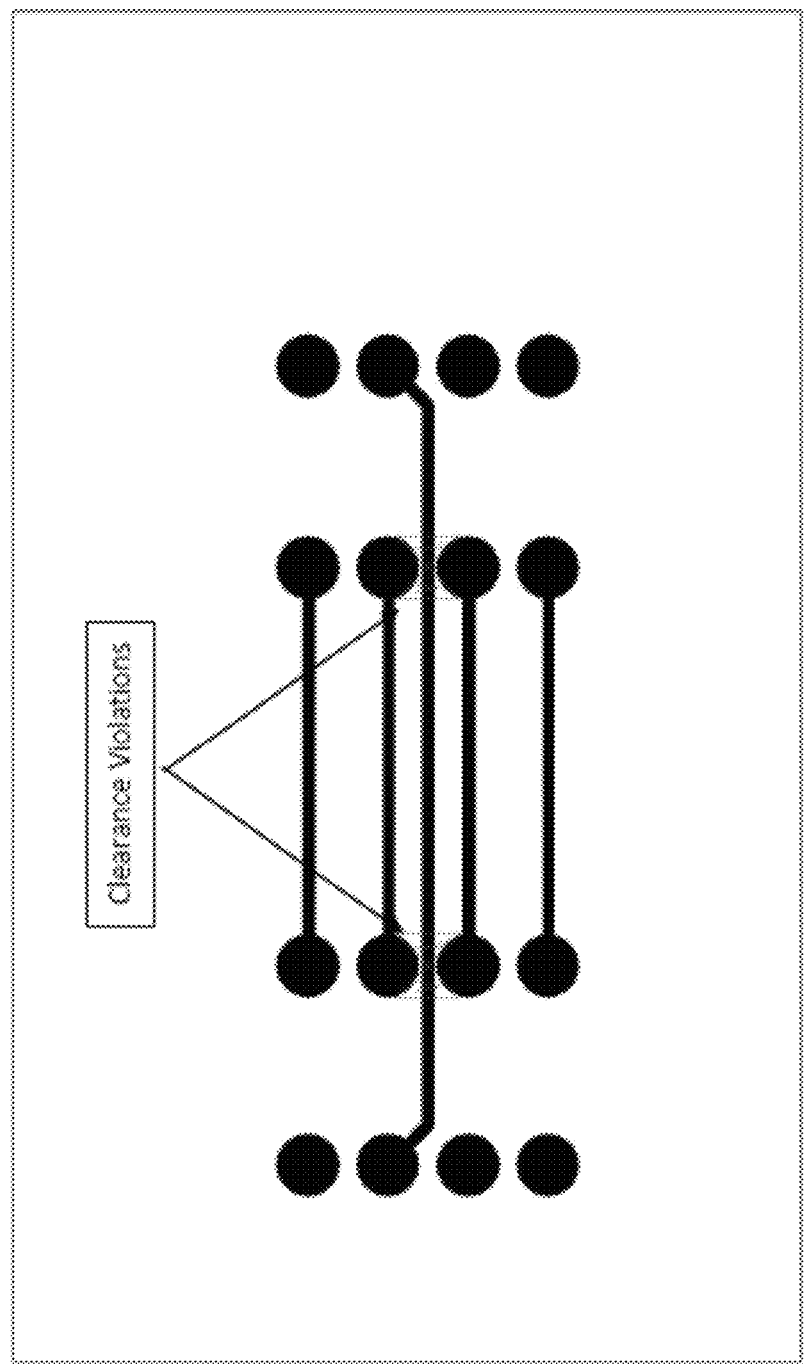
FIG. 24 is a schematic depicting aspects of the routing process in accordance with an embodiment of the present disclosure.
Figure 25:
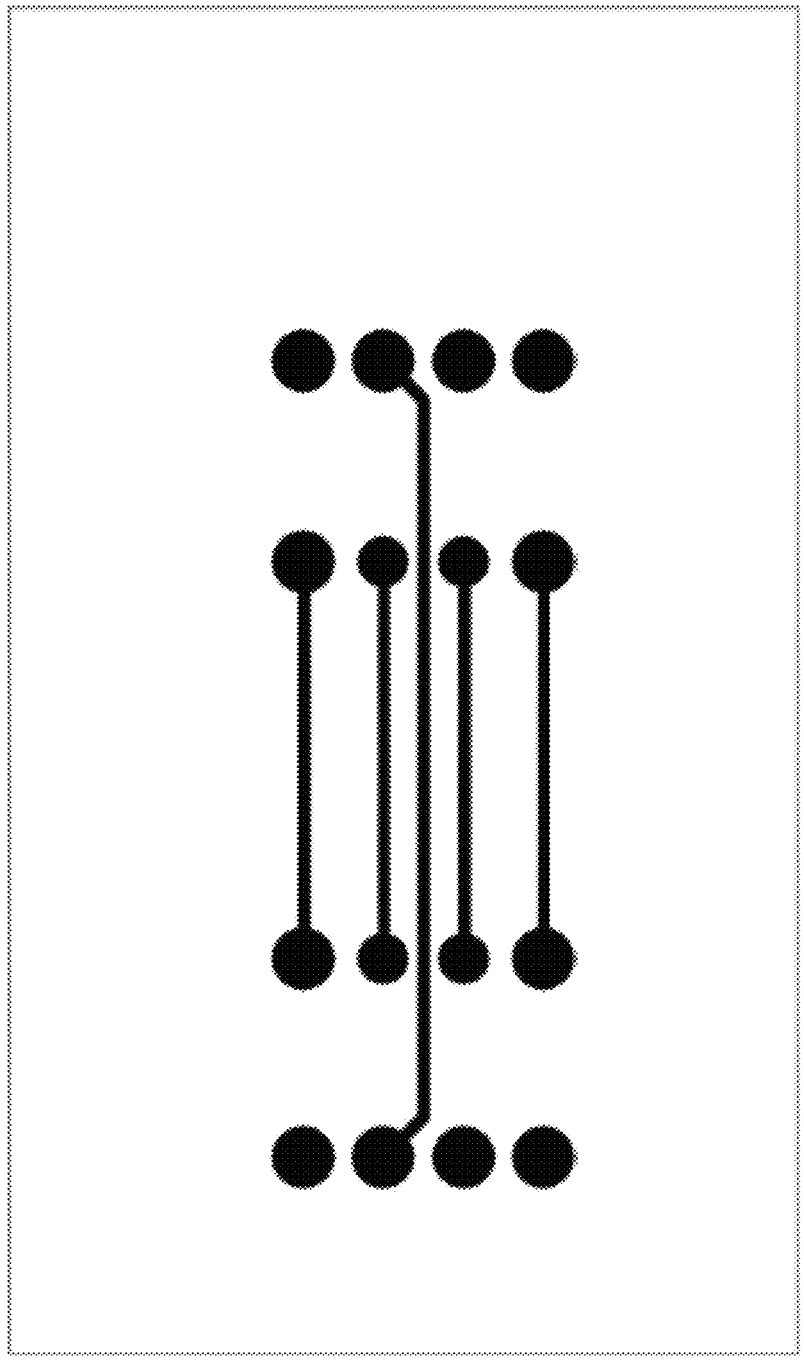
FIG. 25 is a schematic depicting aspects of the routing process in accordance with an embodiment of the present disclosure.

Previous cases started with all non-connected pads suppressed and when connected, the pad is restored to full size. FIG. 22 shows a case where the connection will need to squeeze between pads that can be resized or route around. FIG. 23 shows the wavefront as it probes toward the target. FIG. 24 shows that the new connection before the automatic pad resize. FIG. 25 shows the case where pads are not suppressed, but are made smaller because the pad has a primary and secondary size that is controlled by need based on the track around it. Embodiments of routing process 10 allow the router to select the path based on the cost to reduce the pad size versus the cost to go around. After the path is installed, the pad automatically resizes to a design rule check ("DRC") free value. If the trace is removed, the pad would resize to the original value. In this way, routing process 10 may be configured to change a pad size (e.g. reduce the diameter of the pad, remove a pad entirely, or various combinations thereof. For example, during a particular routing procedure one pad may be removed and another reduced, etc.

Embodiments of routing process 10 may provide the ability to auto or auto-interactively route a single complete or partial connection on designs supporting pad suppression. Routing process 10 may also provide the ability to auto or auto-interactively route multiple complete or partial connections on designs supporting pad suppression. Additionally and/or alternatively, routing process 10 may provide the ability to auto or auto-interactively route single complete or partial connection between pads supporting multiple pad sizes. Accordingly, routing process 10 may utilize a routing algorithm that intelligently understands dynamically changing pads during the process of solving the routing problem. As such the generating 504 and automatically routing 506 steps identified in FIG. 5 may occur, in real-time (e.g., simultaneously) during a simulation and/or during the routing process.

Routing process 10 provides a number of advantages over existing approaches, some of which may include, but are not limited to, providing the customer with an automatic method of routing designs utilizing dynamically changing pad shapes. Embodiments of routing process 10 may take a fraction of the time to route verses the current manual methodology. Although some of the embodiments included herein discuss two layers it should be noted that any number of layers could be employed without departing from the scope of the present disclosure (e.g., complex VGA having 6-8 layers, etc.).

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support one or more software extensions, which may provide a high-throughput channel between the testbench and the device under test (DUT), and enable automated metric driven verification of embedded software exactly as if it were another part of the DUT.

In some embodiments, EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for improved routing to enable fabrication of an electronic circuit design comprising:
   receiving, at one or more computing devices, the electronic circuit design to be fabricated, the electronic circuit design having a plurality of terminal pads associated therewith;
   displaying, at a graphical user interface, a portion of the electronic circuit design, wherein displaying includes displaying a first number of pads on a first layer and a suppressed number of pads on a second layer;
   generating, at the graphical user interface, a change in a size of a first pad of the plurality of terminal pads and generating a new pad;
   performing a costing analysis on the portion of the electronic design wherein the costing analysis includes at least one of a global route environment clearance cost and a global route environment cross cost;
   in response to performing the costing analysis, routing, at the graphical user interface, a portion of the electronic design based upon, at least in part, the generated change and the new pad, wherein generating a change or generating a new pad and routing are performed at least partially simultaneously during a simulation; and
   fabricating an electronic circuit based upon, at least in part, the costing analysis.

2. The computer-implemented method of claim 1, wherein routing includes routing at least one of a single complete connection associated with the electronic design and a partial connection associated with the electronic design.

3. The computer-implemented method of claim 1, wherein routing includes routing a plurality of complete or partial connections associated with the electronic design.

4. The computer-implemented method of claim 1, wherein one or more of the plurality of terminal pads are of different sizes.

5. The computer-implemented method of claim 1, wherein routing includes routing multiple connections associated with the electronic design, wherein at least one of the multiple connections are grouped as a flow or bundle.

6. A computer-readable storage medium for improved routing to enable fabrication of an electronic circuit design, the computer-readable storage medium having stored thereon instructions that when executed by a machine result in the following operations:

receiving, at one or more computing devices, the electronic circuit design to be fabricated, the electronic circuit design having a plurality of terminal pads associated therewith;

displaying, at a graphical user interface, a portion of the electronic circuit design, wherein displaying includes displaying a first number of pads on a first layer and a suppressed number of pads on a second layer;

generating, at the graphical user interface, a change in a size of a first pad of the plurality of terminal pads and generating a new pad;

performing a costing analysis on the portion of the electronic design wherein the costing analysis includes a global route environment clearance cost and a global route environment cross cost;

in response to performing the costing analysis, routing, at the graphical user interface, a portion of the electronic design based upon, at least in part, the generated change and the new wherein generating a change or generating a new pad and routing are performed at least partially simultaneously during a simulation; and fabricating an electronic circuit based upon, at least in part, the costing analysis.

7. The computer-readable storage medium of claim 6, wherein routing includes routing a single complete connection associated with the electronic design and a partial connection associated with the electronic design.

8. The computer-readable storage medium of claim 6, wherein routing includes routing a plurality of complete or partial connections associated with the electronic design.

9. The computer-readable storage medium of claim 6, wherein one or more of the plurality of terminal pads are of different sizes.

10. The computer-readable storage medium of claim 6, wherein routing includes routing multiple connections associated with the electronic design, wherein at least one of the multiple connections are grouped as a flow or bundle.

* * * * *